United States Patent [19]
Cherng

[11] Patent Number: 6,080,628
[45] Date of Patent: Jun. 27, 2000

[54] METHOD OF FORMING SHALLOW TRENCH ISOLATION FOR INTEGRATED CIRCUIT APPLICATIONS

[75] Inventor: George Meng-Jaw Cherng, Hsinchu, Taiwan

[73] Assignee: Vanguard International Semiconductor Corporation, Hsin-Chu, Taiwan

[21] Appl. No.: 09/079,602

[22] Filed: May 15, 1998

[51] Int. Cl.[7] .......................... H01L 21/336; H01L 21/76
[52] U.S. Cl. .......................... 438/296; 438/404; 438/424
[58] Field of Search .......................... 438/296, 404, 438/424

[56] References Cited

U.S. PATENT DOCUMENTS

| | | |
|---|---|---|
| 5,433,794 | 7/1995 | Fazan et al. . |
| 5,506,168 | 4/1996 | Morita et al. . |
| 5,677,229 | 10/1997 | Morita et al. . |
| 5,811,346 | 9/1998 | Sur et al. . |
| 5,868,870 | 2/1999 | Fazan et al. . |
| 5,966,615 | 10/1999 | Fazan et al. . |
| 5,976,948 | 11/1999 | Werner et al. . |
| 6,017,800 | 1/2000 | Sayama et al. . |

*Primary Examiner*—John F. Niebling
*Assistant Examiner*—Josetta Jones
*Attorney, Agent, or Firm*—George O. Saile; Stephen B. Ackerman

[57] ABSTRACT

A new and improved method for fabricating planarized isolation trenches, wherein erosion of insulating material at the edges of trenches is surpressed without sacrificing a minimal width of the isolation trench, has been developed. The process fabricates sidewall spacers before etching the isolation trench into the semiconductor substrate. After filling the etched trench with insulating material and plartarization of the insulating material, the sidewall spacers protect the insulating material filling the trench and prevent the formation of "divots" at the edges of the trench. Since the spacers are formed prior to the etching of the trench in the semiconductor substrate, a minimal width of the isolation trench can be maintained and less area is required for the isolation trench.

2 Claims, 3 Drawing Sheets

METHOD OF FORMING SHALLOW TRENCH ISOLATION FOR INTEGRATED CIRCUIT APPLICATIONS

BACKGROUND OF THE INVENTION

(1) Field of the Invention

This invention relates to a method of fabrication used for semiconductor integrated circuit devices, and more specifically to the formation of trenches to isolate active device areas on a semiconductor substrate.

(2) Description of Related Art

As semiconductor integrated circuits progress toward greater micro-miniaturation active devices are packed into ever smaller areas and electrical isolation between active devices becomes an extremely important issue. Shallow trenches filled with insulating material have proven to be most desirable for isolating active devices. However, the trench isolation process still suffers from a problem of eroded insulating material at trench edges after conventional shallow trench isolation processing. This erosion of insulating material produces "divots" at the edges of the trench and results in abnormal device characteristics, such as the "double hump" in the $I_d$ vs $V_g$ I–V curve, and increased device leakage current. These characteristics are unacceptable for the production of high denisty DRAM. Therefore, a challenge in the industry is to provide a means of formation of planarized isolation trenches without the formation of "divots" at the edges of the trenches.

Numerous improvements to methods of forming planarized isolation trenches have been invented. For example, U.S. Pat. No. 5,433,794 entitled "Spacers Used To Form Isolation Trenches With Impoved Corners" granted Jul. 18, 1995 to Pierre C. Fazan et al describes a method of forming trench isolation in which the isolating material extends over the peripheral edge of the trench, thereby creating a small rounded cap over the trench.

Also, U.S. Pat. No. 5,441,094 entitled "Trench Planarization Techniques" granted Jul. 15, 1995 to Nicholas F. Pasch shocks a method of trench planarization where the trench extends above the surface of the substrate.

U.S. Pat. No. 5,540,811 entitled "Method Of Manufacturing Semiconductor Device" granted Jul. 30, 1996 to Shigeru Morita describes a polishing method for forming trench isolation in which a selectively placed stopper layer is formed on concave portions of the structure.

U.S. Pat. No. 5,275,965 entitled "Trench Isolation Using Gated Sidewalls" granted Jan. 4, 1994 to Monte Manning describes a method of forming trench isolation in which a thin oxide layer forms a gate within the isolation structure.

SUMMARY OF THE INVENTION

It is a general object of the present invention to provide an improved method of forming planarized isolation trenches for use in semiconductor integrated circuits.

A more specific object of the present invention is to provide an improved method of forming planarized isolation trenches for use in semiconductor integrated circuits, wherein erosion of insulating material at the edges of isolation trenches is surpressed.

Another object of the present invention is to provide an improved method of forming planarized isolation trenches, wherein erosion of insulating material at the edges of trenches is surpressed without sacrificing a minimal width of the isolation trench.

In accordance with the present invention, the above and other objectives are realized by using a method of fabricating an oxide-filled trench, having a dome-shaped oxide cap useful for isolating active device areas in a semiconductor substrate. First, a patterned mask structure is formed on the semiconductor substrate containing device regions. The patterned mask structure comprises at least one layer. Next, spacers are created along the edges of the patterned mask structure. Then, a trench is etched in the semiconductor substrate, the pattern of said trench being defined by the patterned mask structure and the spacers along the edges of the patterned mask structure. A first oxide layer is formed on the bottom and sidewalls of the etched trench in the semiconductor substrate and then the etched trench is filled with a second oxide layer, said second oxide layer filling the gap between the spacers, and said second oxide layer also overlaying the patterned mask structure. CMP (Chemical Mechanical Polishing) is used to remove the second oxide layer overlaying the patterned mask structure and to form a planarized surface. Then, the at least one layer of the patterned mask structure is removed, such that portions of the second oxide layer and the spacers extend above the semiconductor substrate. Finally, the portions of the second oxide layer and the spacers extending above the semiconductor substrate are removed, thereby forming an oxide-filled trench, having a dome-shaped oxide cap.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

The process of the present invention solves the problem of eroded insulating material, so-called "divots", as formed at the edges of isolation trenches formed by conventional means. The process of the present invention fabricates sidewall spacers before etching the isolation trench into the semiconductor substrate. After filling the etched trench with insulating material and planarization of the insulating material, the sidewall spacers protect the insulating material filling the trench and prevent the formation of "divots" at the edges of the trench. Since the spacers are formed prior to the etching of the trench in the semiconductor substrate, a minimal width of the isolation trench can be maintained and less area is required for the isolation trench. If spacers are formed after etching of the trench, as in U. S. Pat. No. 5,433.794, additional width is added to the isolation trench and this impacts the packing density of active devices on the substrate.

The new and improved method for fabricating planarized isolation trenches, wherein erosion of insulating material at the edges of trenches is surpressed without sacrificing a minimal width of the isolation trench, will now be described in detail.

Referring to FIGS. 1A–1I, semiconductor substrate 10 is coated with a patterned masking structure comprising layers 11 and 12. Semiconductor substrate 10 is preferably single crystal silicon, but may be any semiconductor material, such as silicon or gallium arsenide used in the fabrication of integrated circuits. Layer 11 comprises silicon oxide having a thickness between about 100 and 500 Angstroms. Layer 12 comprises SiN having a thickness between about 500 and 5,000 Angstroms. Layers 11 and 12 are patterned with a window 13 defining the region where the isolation trench is to be formed.

Figure 1A:
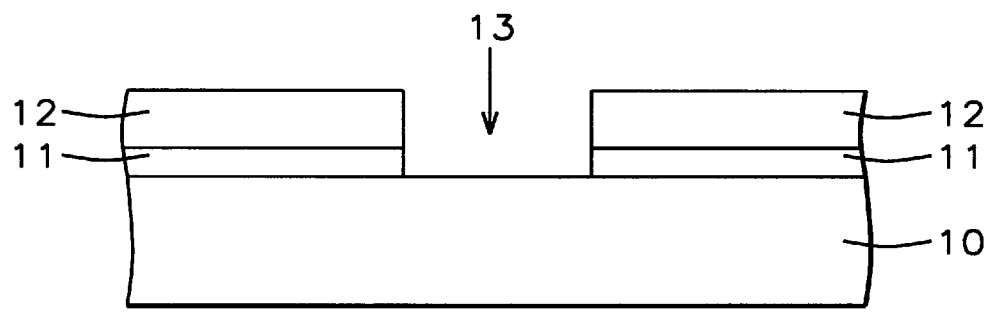
FIGS. 1A–1I, which schematically, in cross-sectional representation, illustrate the method of one embodiment of the present invention.
Figure 1B:
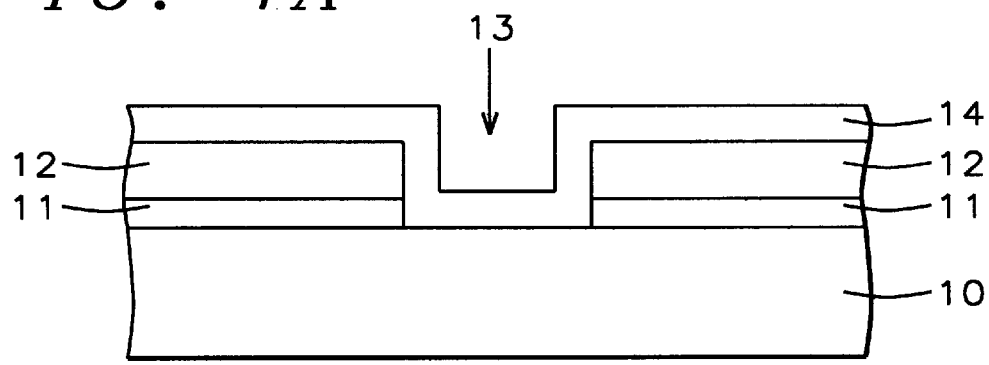
Figure 1C:
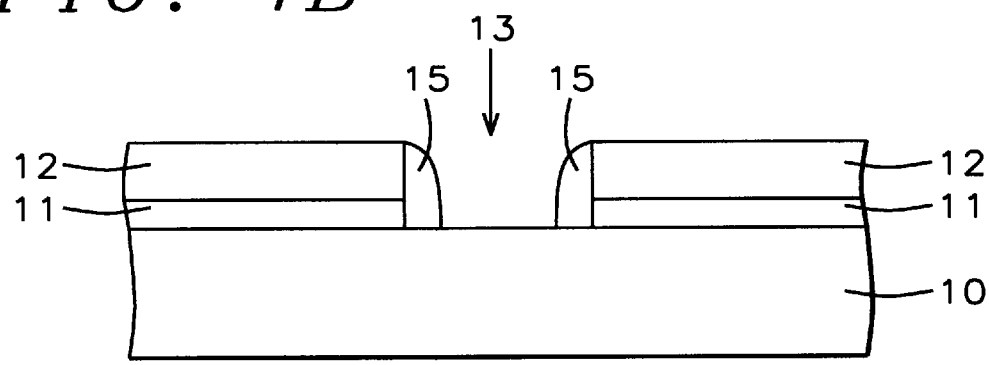
Figure 1D:
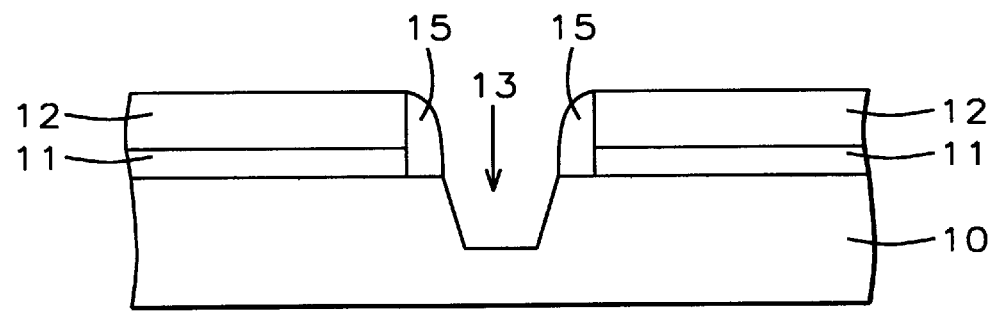
Figure 1E:
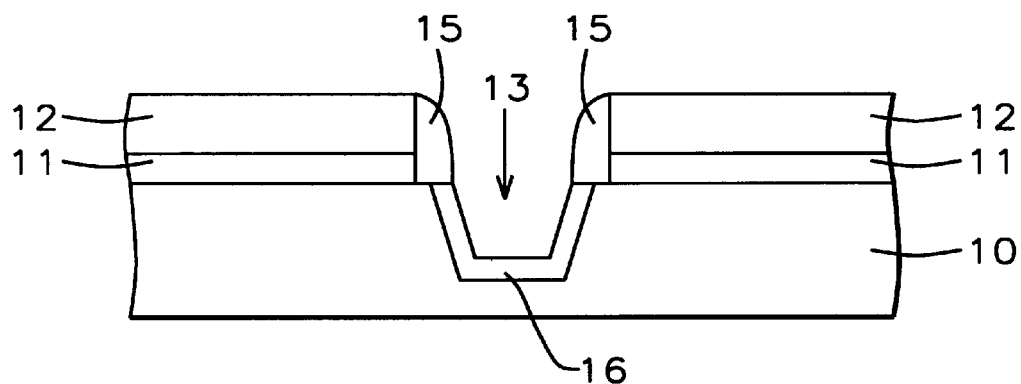

As shown in FIG. 1B, layer 14 is a dielectric material deposited conformally over the top surface of the patterned mask structure, over the sidewalls of the patterned mask structure, and onto the the semiconductor substrate. Layer 14 is preferably silicon oxide deposited by LPCVD (Low Pressure Chemical Vapor Deposition) processes to a thickness between about 500 and 3,000 Angstroms. Another suitable dielectric material is silicon nitride. Next, as shown in FIG. 1C, anisotropic etching of the dielectric material layer 14 removes the dielectric material from the top surface of the patterned mask structure and from the semiconductor substrate leaving spacers 15, formed from the dielectric material, remaining on the sidewalls of the patterned mask structure. Conventional anisotropic etching is performed using plasma etch processes. Following the anisotropic etching of dielectric material 14, remaining spacers 15 hare a width between about 500 and 2,000 Angstroms. Referring now to FIG. 1D, a trench is etched into semiconductor substrate 10 using conventional RIE processes. The preferred depth of the trench is between about 0.3 and 0.7 microns. The trench sidewalls can be substantially vertical to the substrate, or slightly sloped, i.e., having an angle between about 90° and 70° to the substrate. The width of the trench is defined by the dimensions of the patterned mask structure and the width of the spacers along the edges of the patterned mask stricture. After etching the trench a first oxide layer 16 is formed on the bottom and on the sidewalls of the etched trench, as shown in FIG. 1E. First oxide layer 16 is preferably silicon oxide, having a thickness between about 100 and 1,000 Angstroms. A second oxide layer 17 is deposited to fill the etched trench, said second oxide layer fills the gap between the spacers, and said second oxide layer also overlays the patterned mask structure. Second oxide layer 17 is preferably silicon oxide, formed by CVD deposition processes and has a thickness between about 3,000 and 10,000 Angstroms.

Figure 1F:
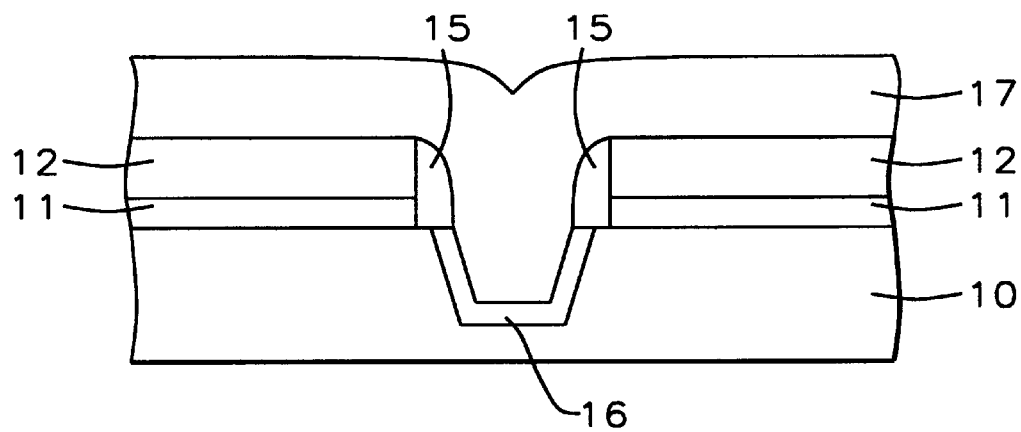
Figure 1G:
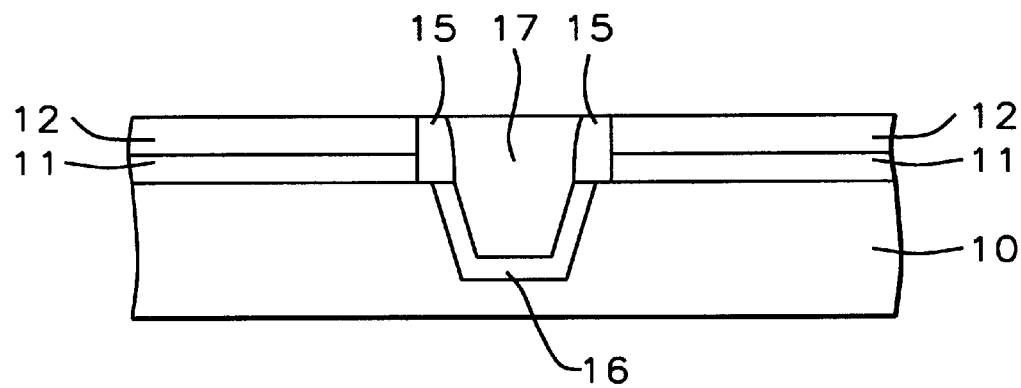
Figure 1H:
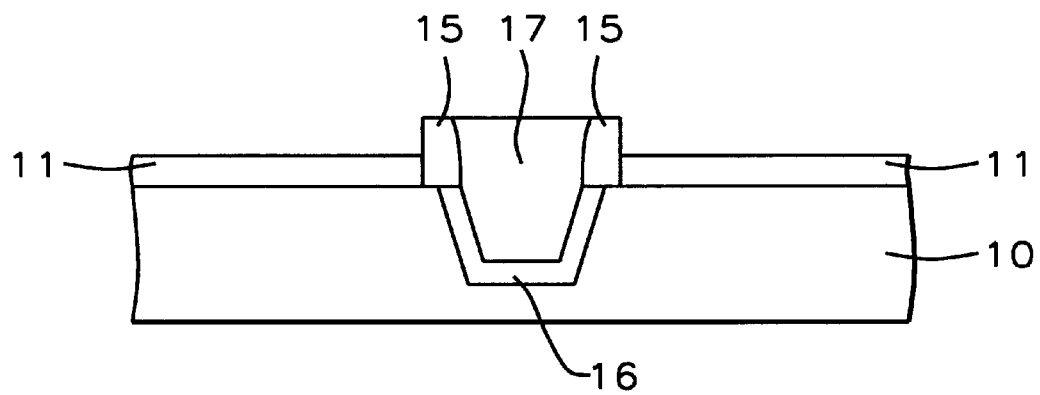

Now referring to FIGS. 1F and 1G, CMP is used to remove the second oxide layer 17 overlaying the patterned mask structure. The CMP is performed in a conventional CMP apparatus using a polishing slurry comprising KOH or $NH_4OH$ and abrasive materials, $SiO_2$, $Al_2O_3$ or $CeO_2$. SiN layer 12 acts as a polishing stop layer for the CMP process. Next, the remaining SiN layer 12 is removed, resulting in the cross-sectional structure shown in FIG. 1H. The SiN layer 12 may be removed by a wet etch in an etch solution of hot phosphoric acid ($H_3PO_4$) or by RIE (Reactive Ion Etching) in an ambient containing $O_2$ and $CHF_3$. The result is a trench filled with the second oxide layer 17 and with portions of the second oxide layer 17 and the spacers 15 extending above the semiconductor substrate 10.

Figure 1I:
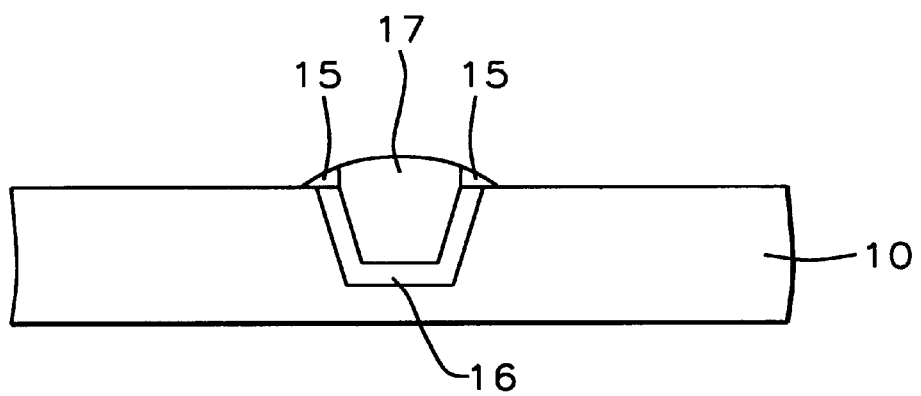

Finally, as shown in FIG. 1I, the portions of the second oxide layer 17 and the spacers 15 extending above the semiconductor substrate are removed, thereby forming an oxide-filled trench having a dome-shaped oxide cap. Removal of the portions of the second oxide layer and the spacers extending above the semiconductor substrate may be by wet etch in an etch solution comprising dilute HF or buffered HF, by RIE in an ambient containing $CF_4$ or $C_4F_8$, or by CMP in a slurry comprising KOH or $NH_4OH$ and abrasive materials, $SiO_2$, $Al_2O_3$ or $CeO_2$. The result is an oxide-filled isolation trench having a smooth profile and protected edges of the trench, thereby substantially overcoming the "divots" effect and preventing current leakage between active areas on the semiconductor substrate.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an oxide filled trench, having a dome-shaped oxide cap useful for isolating active device areas in a semiconductor substrate, comprising the steps of:

providing said semiconductor substrate containing device regions;

forming a patterned mask structure comprising a layer of SiN having a thickness between about 500 and 5,000 Angstroms over a layer of silicon oxide having a thickness between about 100 and 500 Angstroms on said semiconductor substrate;

creating spacers having a width between about 500 and 2,000 Angstroms, along the edges of said patterned mask structure by depositing a layer of dielectric material conformally over the top surface of said patterned mask structure, over the sidewalls of said patterned mask structure, and onto said semiconductor substrate and anisotropically etching said layer of dielectric material from the top surface of said patterned mask structure and from said semiconductor substrate;

etching a trench in said semiconductor substrate, the pattern of said trench being defined by said patterned mask structure and said spacers along the edges of said patterned mask structure;

forming a first oxide layer, comprising silicon oxide having a thickness between about 100 and 1,000 Angstroms, on the bottom and sidewalls of the etched trench in said semiconductor substrate;

filling said etched trench with a second oxide layer, comprising silicon oxide formed by CVD deposition processes and having a thickness between about 3,000 and 10,000 Angstroms, said second oxide layer filling the gap between said spacers, and said second oxide layer also overlaying said patterned mask structure;

using CMP to remove said second oxide layer overlaying said patterned mask structure, wherein said CMP to remove said oxide layer overlying said patterned mask structure is in a slurry comprising KOH or $NH_4OH$ and abrasive material $SiO_2$ $A_2O_3$ or $CeO_2$;

removing said patterned mask structure, wherein said layer of SiN is removed by RIE in an ambient containing $O_2$ and $CHF_3$ such that portions of said second oxide layer and said spacers extend above said semiconductor substrate; and removing said portions of said second oxide layer and said spacers extending above said semiconductor substrate by RIE in an ambient containing $CF_4$ or $C_4F_8$ or by CMP in a slurry comprising KOH or $NH_4OH$ and abrasive material $SiO_2$, $Al_2O_3$ or $Ceo_2$, thereby forming said oxide filled trench, having a dome-shaped oxide cap.

2. A method of fabricating an oxide filled trench, having a dome-shaped oxide cap useful for isolating active device areas in a silicon substrate, comprising the steps of:

providing said silicon substrate containing device regions;

forming a patterned mask structure comprising a layer of SiN having a thickness between about 500 and 5,000 Angstroms over a layer of silicon oxide having a thickness between about 100 and 500 Angstroms on said silicon substrate;

creating spacers having a width between about 500 and 2,000 Angstroms, along the edges of said patterned mask structure by depositing a layer of dielectric material conformally over the top surface of said patterned mask structure, over the sidewalls of said patterned mask structure, and onto said silicon substrate and anisotropically etching said layer of dielectric material from the top surface of said patterned mask structure and from said silicon substrate;

etching a trench in said silicon substrate, the pattern of said trench being defined by said patterned mask structure and said spacers along the edges of said patterned mask structure;

forming a first oxide layer, comprising silicon oxide having a thickness between about 100 and 1,000 Angstroms, on the bottom and sidewalls of the etched trench in said silicon substrate;

filling said etched trench with a second oxide layer, comprising silicon oxide formed by CVD deposition processes and having a thickness between about 3,000 and 10,000 Angstroms, said second oxide layer filling the gap between said spacers, and said second oxide layer also overlaying said patterned mask structure;

using CMP to remove said second oxide layer overlaying said patterned mask structure, wherein said CMP to remove said oxide layer overlaying said patterned mask a structure is in a slurry comprising KOH or $NH_4OH$ and abrasive material $SiO_2$, $Al_2O_3$ or $CeO_2$;

removing said patterned mask structure, wherein said layer of SiN is removed by RIE in an ambient containing $O_2$ and $CHF_3$ such that portions of said second oxide layer and said spacers extend above said silicon substrate; and removing said portions of said second oxide layer and said spacers extending above said silicon substrate by RIE in an ambient containing $CF_4$ or $C_4F_8$ or by CMP in a slurry comprising KOH or $NH_4OH$ and abrasive material $SiO_2$, $Al_2O_3$ or $CeO_2$, thereby forming said oxide filled trench, having a dome-shaped oxide cap.

* * * * *